United States Patent
Wang et al.

(10) Patent No.: US 8,664,523 B2
(45) Date of Patent: Mar. 4, 2014

(54) FIBER OPTIC SOLAR NANOGENERATOR CELLS

(75) Inventors: Zhong L. Wang, Marietta, GA (US); Benjamin Weintraub, Atlanta, GA (US); Yaguang Wei, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1009 days.

(21) Appl. No.: 12/750,259

(22) Filed: Mar. 30, 2010

(65) Prior Publication Data
US 2010/0258160 A1 Oct. 14, 2010

Related U.S. Application Data

(63) Continuation-in-part of application No. 12/194,943, filed on Aug. 20, 2008.

(60) Provisional application No. 61/051,386, filed on May 8, 2008, provisional application No. 61/164,726, filed on Mar. 30, 2009, provisional application No. 61/164,730, filed on Mar. 30, 2009, provisional application No. 61/165,096, filed on Mar. 31, 2009.

(51) Int. Cl.
  *H01L 31/0352* (2006.01)
(52) U.S. Cl.
  USPC ............. 136/259; 136/252; 136/246; 438/72; 257/E31.032
(58) Field of Classification Search
  USPC ............................ 136/259, 252, 246; 438/72; 257/E31.032
  See application file for complete search history.

(56) References Cited

U.S. PATENT DOCUMENTS

| | | | | |
|---|---|---|---|---|
| 4,088,388 | A * | 5/1978 | Nakahara et al. | 385/127 |
| RE29,833 | E * | 11/1978 | Mlavsky | 136/246 |
| 4,617,192 | A * | 10/1986 | Chin et al. | 438/38 |
| 5,756,224 | A * | 5/1998 | Borner et al. | 428/690 |
| 7,047,800 | B2 * | 5/2006 | Thiesen et al. | 73/146 |
| 7,067,846 | B2 * | 6/2006 | Takahashi et al. | 257/79 |
| 7,235,736 | B1 * | 6/2007 | Buller et al. | 136/251 |
| 2004/0118448 | A1 * | 6/2004 | Scher et al. | 136/252 |
| 2004/0265587 | A1 * | 12/2004 | Koyanagi et al. | 428/398 |
| 2005/0257827 | A1 * | 11/2005 | Gaudiana et al. | 136/263 |
| 2006/0185714 | A1 * | 8/2006 | Nam et al. | 136/244 |
| 2007/0111368 | A1 * | 5/2007 | Zhang et al. | 438/99 |
| 2007/0116640 | A1 * | 5/2007 | Kim et al. | 423/610 |
| 2007/0209696 | A1 * | 9/2007 | Duerr et al. | 136/252 |
| 2007/0215195 | A1 * | 9/2007 | Buller et al. | 136/243 |
| 2008/0029152 | A1 * | 2/2008 | Milshtein et al. | 136/252 |
| 2008/0041446 | A1 * | 2/2008 | Wu et al. | 136/263 |

* cited by examiner

*Primary Examiner* — Golam Mowla
(74) *Attorney, Agent, or Firm* — Bryan W. Bockhop; Bockhop & Associates, LLC

(57) ABSTRACT

A solar cell employs an optical fiber and semiconductor nanowires grown around the fiber. A p-n junction based design, organic-inorganic heterojunction, or a dye-sensitized structure is built at the surfaces of the nanowires. Light entering the fiber from a tip propagates through the fiber until it enters a nanowire where it reaches a photovoltaic element. Light entering the fiber cannot escape until it interacts with a photovoltaic element, thereby increasing the solar conversion efficiency. The fiber can transmit light, while the nanowires around the fibers increase the surface area of light exposure.

4 Claims, 11 Drawing Sheets

FIBER OPTIC SOLAR NANOGENERATOR CELLS

CROSS-REFERENCE TO RELATED APPLICATION(S)

This application claims the benefit of: U.S. Provisional Patent Application Ser. No. 61/164,726, filed Mar. 30, 2009; U.S. Provisional Patent Application Ser. No. 61/164,730, filed Mar. 30, 2009; and U.S. Provisional Patent Application Ser. No. 61/165,096, filed Mar. 31, 2009; the entirety of each of which is hereby incorporated herein by reference.

This application is a continuation-in-part of, and claims the benefit of, U.S. patent application Ser. No. 12/194,943, filed Aug. 20, 2008, which is a non-provisional of U.S. Provisional Patent Application Ser. No. 61/051,386, filed May 8, 2008, the entirety of each of which is hereby incorporated herein by reference.

BACKGROUND OF THE INVENTION

1. Field of the Invention

The present invention relates to electric power generation systems and, more specifically, to a hybrid solar power and mechanical power generating system.

2. Description of the Related Art

There are generally three different sources for scavenging energy from the environment: solar energy, thermal energy and mechanical energy (such as wind energy). Solar cells are typically used to collect solar energy and transform it into electrical energy. However, solar cells cannot produce electricity at times when there is insufficient ambient light, such as in the evening.

Mechanical energy, from large-scale winds to micro-scale vibration, is almost always available. Thus, a system for converting mechanical energy to electricity would be able to produce electricity almost anywhere at almost any time.

Recently, a ZnO nanowire-based nanogenerator that can effectively convert small scale mechanical vibration energy into electricity has been demonstrated. However, the power output of the nanogenerator was relatively low in some applications.

The highest efficiency solar cells to date (40.7%) employ optical lenses to focus light onto the photovoltaic materials. These concentrators are expensive and have therefore been limited in scalability.

Driven by the telecommunications industry, there has been a tremendous amount of research in the past two decades into fiber optic cables as a medium for transporting data in the form of light. At present, a mature infrastructure is in place for mass production of optical fibers. State-of-the-art fibers can transport light up to distances of 500-800 km with low signal attenuation owing to the physical principle of total internal reflection. Given these characteristics, fiber optic cables are potentially an ideal medium for directing light towards a photovoltaic material system for solar energy harvesting.

Therefore, there is a need for a hybrid nanogenerator that combines a highly efficient solar cell with a piezoelectric nanogenerator that can generate power continuously in a range of different and changing environments.

There is also a need for a scalable optical system which can transport the light energy to the photovoltaic elements.

SUMMARY OF THE INVENTION

The disadvantages of the prior art are overcome by the present invention which, in one aspect, is a hybrid solar and mechanical power generator that includes a solar power generating portion and a piezoelectric nanowire vibrational power generating portion. The solar power generating portion electrically coupled to a first electrode. The piezoelectric nanowire vibrational power generating portion includes an electrical contact structure electrically coupled to and extending downwardly from the first electrode and disposed adjacent to the solar power generating portion. A plurality of piezoelectric semiconductor nanorods extends upwardly from a second electrode that is spaced apart from the first electrode so as to be directed toward the electrical contact structure. The plurality of piezoelectric semiconductor nanorods are configured to release electrons across a Schottky barrier formed between the piezoelectric semiconductor nanorods and the electrical contact structure when mechanical energy is applied to the piezoelectric nanowire vibrational power generating portion.

In another aspect, the invention is a hybrid solar-mechanical power generator that includes a solar power generating portion electrically coupled to a first electrode and a piezoelectric nanowire vibrational power generating portion. The piezoelectric nanowire vibrational power generating portion includes a plurality of piezoelectric semiconductor nanorods extending downwardly from the first electrode and an electrical contact structure electrically coupled to and extending upwardly from a second electrode and spaced apart from the first electrode. The electrical contact structure is disposed so as to be directed toward the plurality of piezoelectric semiconductor nanorods and configured so that when mechanical energy is applied to the piezoelectric nanowire vibrational power generating portion the piezoelectric semiconductor nanorods contact the electrical contact structure and the nanorods release electrons across a Schottky barrier formed between the piezoelectric semiconductor nanorods and the electrical contact structure.

In another aspect, the invention is a solar power element that includes an optical fiber. A conductive outer cladding surrounds the optical fiber. A plurality of nanorods extends radially outwardly from the conductive outer cladding.

In yet another aspect, the invention is a method of making a hybrid solar and mechanical power generator, in which a conductive material layer is applied to a first substrate. A nanorod seed material is applied to a portion of both the conductive layer and to the first substrate. A first plurality of nanorods is grown from the nanorod seed material. A liquid is applied to the nanorods grown from the substrate. The liquid is a liquid that will cause nanorods in contact therewith to agglomerate into a plurality of pointed structures. A metal layer is applied to the pointed structures. A second plurality of nanorods is grown from a second substrate. The second substrate is disposed so as to be parallel to the first substrate and so that the second plurality of nanorods extends toward the plurality of pointed structures. A flexible spacer is placed between the first substrate and the second substrate.

In yet another aspect, the invention is a solar collector cell. An optically transparent elongated prism includes a plurality of flat faces and includes a material that causes light entering therein to be reflected internally. A plurality of elongated nanostructures extend outwardly from at least one of the plurality of flat faces. An optically sensitive dye is adsorbed onto the plurality of elongated nanostructures. The optically sensitive dye is configured to absorb photons from light received through the optically transparent elongated prism. An electrode is coupled to the plurality of elongated nanostructures. The electrode is configured to transport electrons generated by the optically sensitive dye as a result of light being absorbed therein.

In yet another aspect, the invention is a solar battery that includes an array of solar collector cells. Each cell includes an optically transparent planar structure that includes two opposite flat faces and that includes a material that causes light entering therein to be reflected internally. A plurality of elongated nanostructures extend outwardly from at least one of the flat faces. An optically sensitive dye is adsorbed onto the plurality of elongated nanostructures. The optically sensitive dye is configured to absorb photons from light received through the optically transparent elongated prism. A first electrode, coupled to the plurality of elongated nanostructures, is configured to transport electrons generated by the optically sensitive dye as a result of light being absorbed therein.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
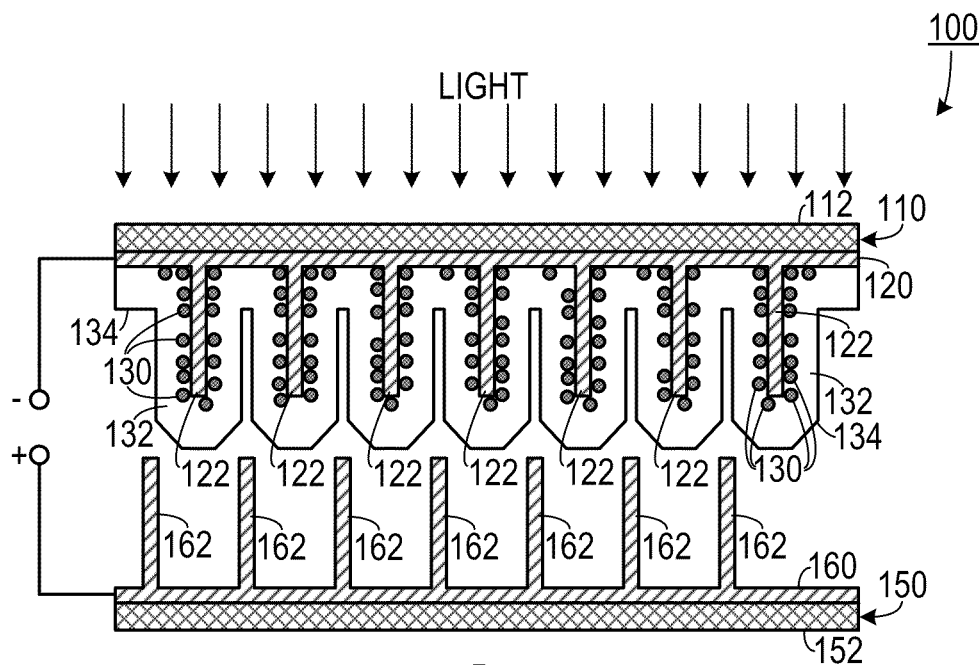
FIG. 1 is a schematic elevational view of a first representative embodiment of a hybrid solar and mechanical electrical power generator.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

As shown in FIG. 1, one embodiment of a hybrid solar and mechanical power generator 100 includes a dye-sensitized solar power generating portion 110 that is electrically coupled to a first electrode 120. The solar power generating portion 110 includes a transparent substrate 112 (such as an ITO substrate) affixed to the first electrode 120. A plurality of semiconductor nanorods 122 (such as ZnO nanorods), also referred to as "nanowires," extend from the first electrode. A light absorbing material having a predetermined optical absorption range is applied to the plurality of nanorods 122. In one embodiment, the light absorbing material includes a plurality of ruthenium-based dye particles 130, such as cis-bis(isothiocyanato) bis(2,2'-bipyridyl-4,4'-dicarboxylato)-ruthenium(II) bis-tetrabutylammonium, also referred to as N719 Dye(B2). The dye particles 130 should have an optical absorption range that includes the wavelengths of light to be converted into electrical energy. The growth of ZnO nanorods is disclosed in more detail in U.S. patent application Ser. No. 11/608,865, filed on Dec. 11, 2006 by Wang et al. and U.S. Pat. No. 7,220,310, issued on May 22, 2007 to Wang et al. and U.S. Pat. No. 7,351,607, issued on Apr. 1, 2008 to Wang et al., the entirety of each of which is hereby incorporated by reference. The nanorods 122 can be grown, for example, by physical vapor deposition process or with a wet chemical process.

A transparent housing 134 (which can include a layer of a metal such as gold) surrounds the nanorods 122 and an electrolyte 132 (such as an iodide based electrolyte) is disposed in the housing 134 and the nanorods 122. The housing 134 acts as an electrical contact structure that is electrically coupled to the first electrode 120.

A piezoelectric nanowire vibrational power generating portion 150 is disposed parallel to the solar power generating portion 110. The piezoelectric nanowire vibrational power generating portion 150 includes a second transparent substrate 152 (such as an ITO substrate) and a plurality of aligned piezoelectric semiconductor nanorods 162 (such as ZnO nanorods) extending upwardly from a second electrode 160, which are directed toward the housing 134.

The solar power generating portion 110 is positioned relative to the vibrational power generating portion 150 so that the electrical contact structure 120 contacts the piezoelectric semiconductor nanorods 162 when mechanical force is applied to either portion (e.g., due to vibrational energy being applied thereto), the piezoelectric semiconductor nanorods 162 will contact the housing 134 and bend. Once bent, the piezoelectric semiconductor nanorods 162 will release electrons across a Schottky barrier formed between the piezoelectric semiconductor nanorods 162 and the housing 134.

Figure 2A:
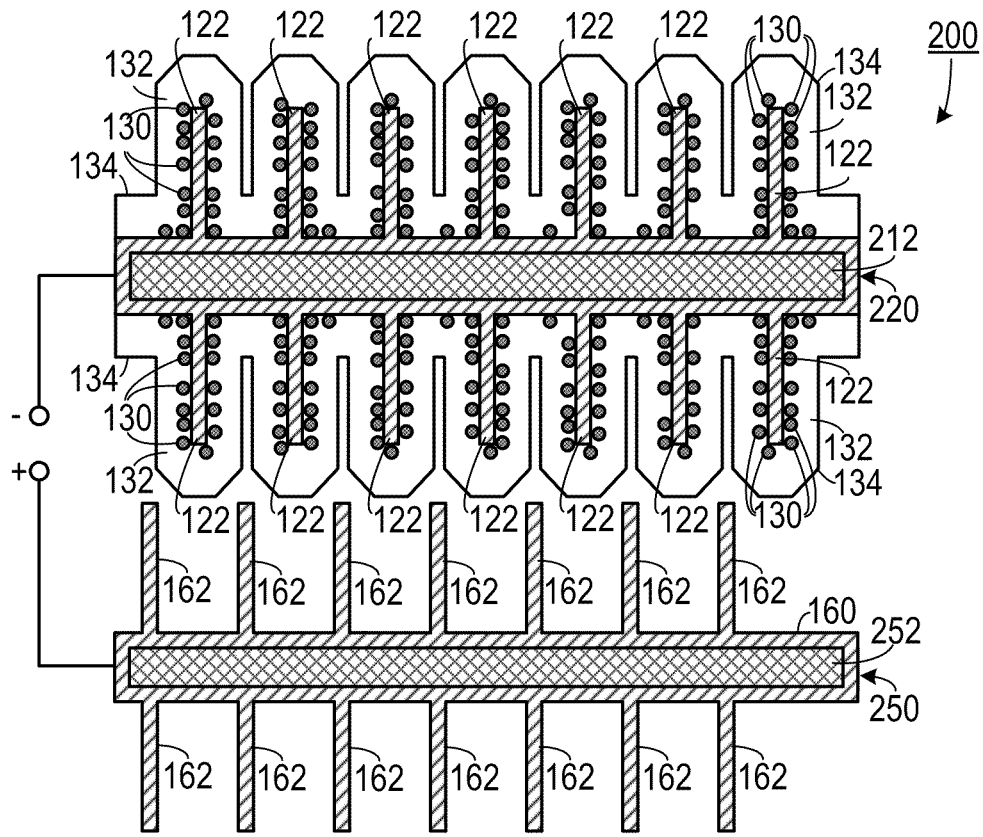
FIG. 2A is a schematic elevational view of a second representative embodiment of a hybrid solar and mechanical electrical power generator.
Figure 2B:
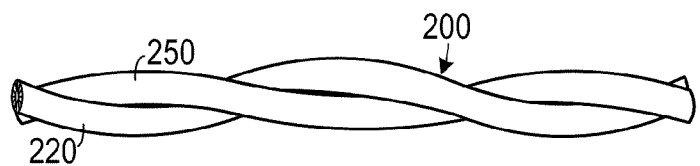
FIG. 2B is a schematic elevational view of an embodiment disposed on textile threads and intertwined.

As shown in FIGS. 2A and 2B, in one embodiment the solar power generating portion 220 may be mounted on a first textile fiber 212 and the piezoelectric nanowire vibrational power generating portion 250 may be mounted on a second textile fiber 252 that is intertwined with the first textile fiber 212. In this design, the relative movement of the two fibers 220 and 250 will generate electricity due to the principle of piezo-electronics. Meanwhile, shining of light will excite the solar cell portion on the back of the contact region to generate electricity as well. These fibers can also be interwoven into a fabric.

Figure 3A:
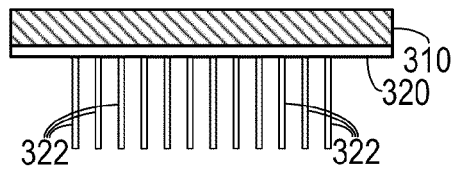
FIGS. 3A-3G are schematic diagrams demonstrating a first method of assembling a hybrid solar and mechanical electrical power generator.
Figure 3B:
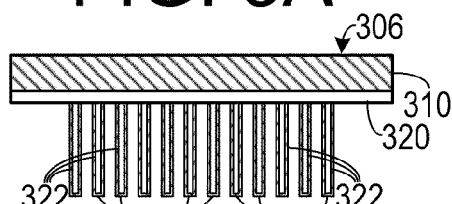

As shown in FIGS. 3A-3G, one method of making a hybrid solar and mechanical power generator 300. Initially, as shown in FIG. 3A, a plurality of nanorods 322 is grown from an electrode 320 affixed to a transparent substrate 310. The nanorods 322 are then coated with a layer 322 of dye molecules, as shown in FIG. 3B, to form a solar collecting unit 306.

Figure 3F:
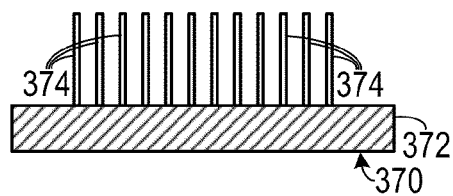
Figure 3C:
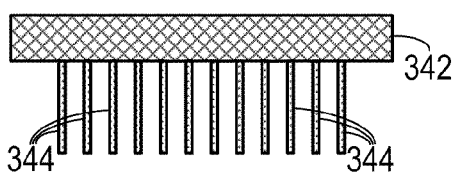
Figure 3D:
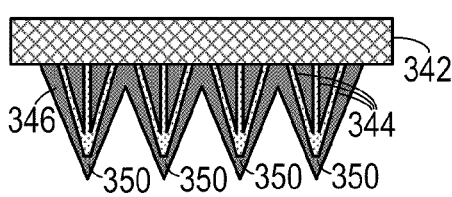
Figure 3E:
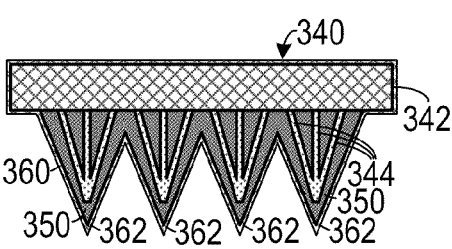
Figure 3G:
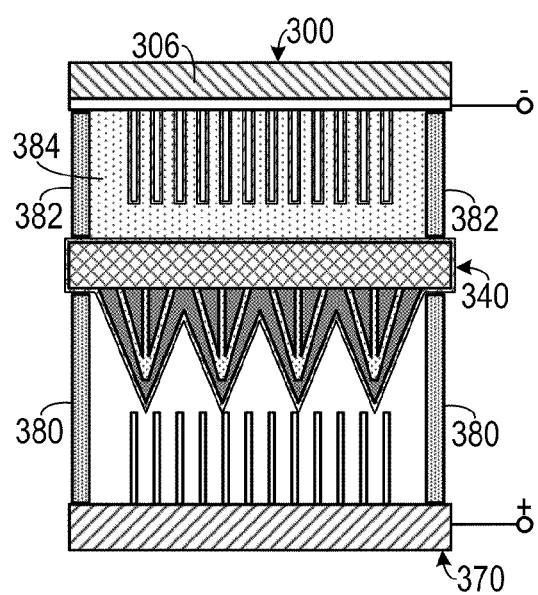

As shown in FIG. 3C, a second plurality of nanorods 344 is grown from a substrate 342. An electrolyte 346, such as a p-type polymer, is then applied to bury the nanorods 344. As shown in FIG. 3D, due to the high aspect ratio of the nanorods, pyramid-shaped extrusions 350 form as a result of the addition of the electrolyte 346. As shown in FIG. 3E, a metal layer 360 (such as a layer of gold, or any other metal that can form a Schottky junction with ZnO) is deposited on the electrolyte pyramid-shaped extrusions 350, thereby forming an array 340 of conductive extrusions 362. The metal layer 360 plays two roles: it acts as a cathode of the solar portion and as an electron collector for the piezoelectric nanogenerator portion.

As shown in FIG. 3F, a third plurality of nanorods 374 is grown from a substrate 372. These form a piezoelectric semiconducting nanorod unit 370.

The hybrid generator 300 is then assembled by stacking the array 340 of conductive extrusions 362 on top of the piezoelectric semiconducting nanorod unit 370, separating the with a spacer 380, and placing the solar collecting unit 306 on the array 340 of conductive extrusions 362, separating them with sealing spacer 382 and then injecting an electrolyte 384 into the solar collecting unit 306. Alternately, the electrolyte 384 is applied to the solar collecting unit 306 prior to the application of the sealing spacer 382.

In an alternate embodiment, as shown in FIGS. 4A-4F, a hybrid generator 440 can be formed by generating a solar collecting unit 306 as described above. A mechanical piezoelectric nanorod unit 400 is generated by growing a plurality of nanorods 412 from a substrate 410 and coating the substrate 410 with a conductive layer 414 (such as a metal, e.g., gold or platinum). The solar unit 306 is placed above the mechanical piezoelectric nanorod unit 400 and separated by a sealing spacer 380 and an electrolyte 382 is injected into the solar collecting unit 306.

Figure 4A:
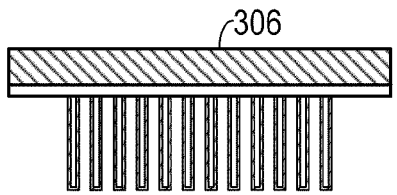
FIGS. 4A-4F are schematic diagrams demonstrating a second method of assembling a hybrid solar and mechanical electrical power generator.
Figure 4B:
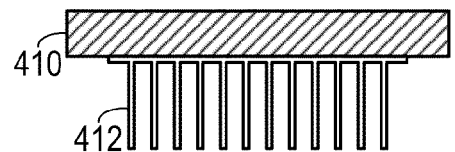
Figure 4C:
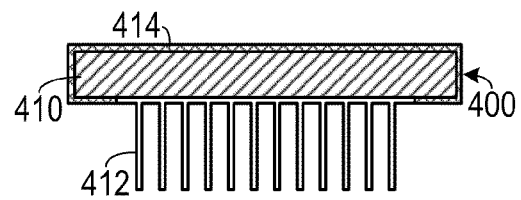
Figure 4D:
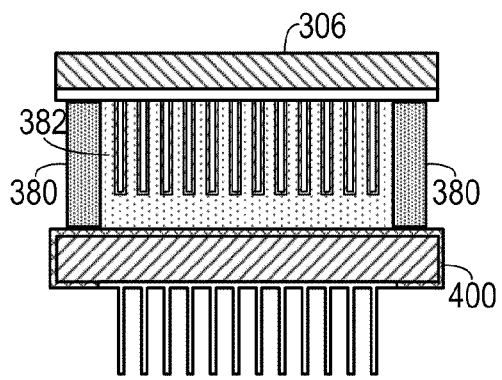
Figure 4E:
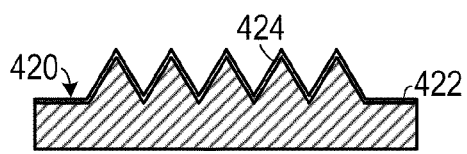
Figure 4F:
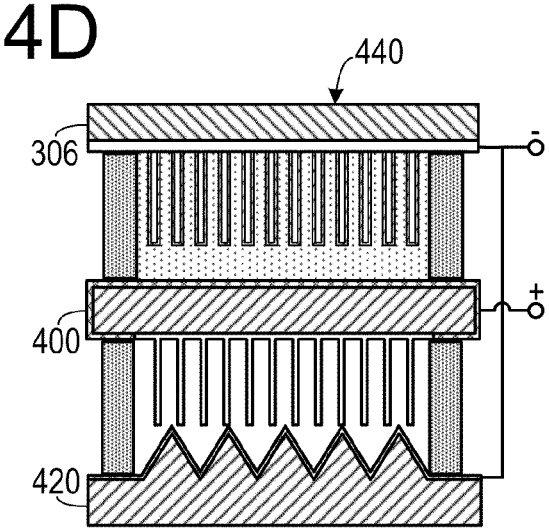

A corrugated contact unit 420, as shown in FIG. 4E, is generated by patterning a substrate 122 with a plurality of corrugations (such as an array of pyramids, an array of trenches, an array of corrugations, an array of crenulations, an array of nano-bowls or combinations thereof) and depositing a metal layer 424 thereon. The solar collecting unit 306, the mechanical piezoelectric nanorod unit 400 and the corrugated contact unit 420 are then stacked upon each other, as shown in FIG. 4F.

Figure 5A:
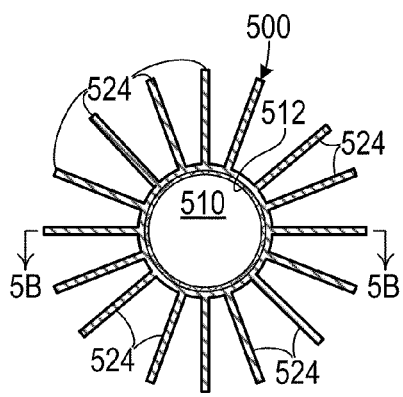
FIG. 5A is a top plan view of a fiber-mounted solar power generator.
Figure 5B:
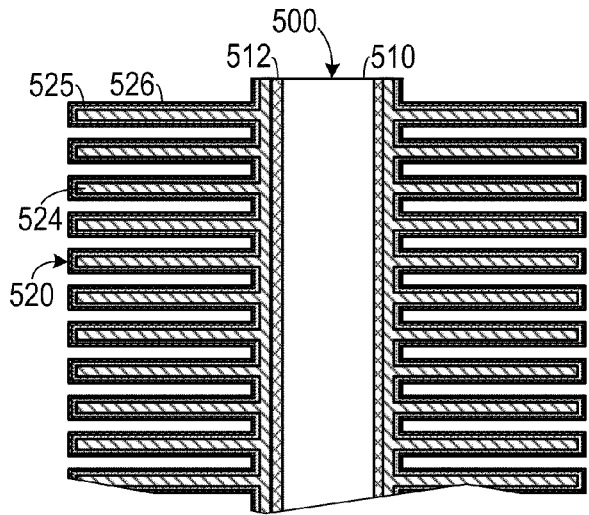
FIG. 5B is a cross-sectional view of the fiber-mounted solar power generator shown in FIG. 5A, taken along line 5B-5B.

As shown in FIGS. 5A and 5B, in one embodiment of a fiber photovoltaic collector 500, an electrode layer 512 (such as ITO) can be applied to an optical fiber 510 (such as an $SiO_2$ optical fiber) and a plurality of nanorods 524 can be grown radially outwardly therefrom. If the nanorods 524 are made of ZnO, then they act as an n-type semiconductor. In certain embodiments, the nanorods could be made of such materials as ZnO, ZnS, Si, GaN, GaInP, GaInAs, Ge, and combinations thereof. As shown in FIG. 5B, the nanorods 524 can be coated with a p-type direct gap semiconducting layer 525 (such as a $Cu_2O$, $Cu_2S$ and $CuInS_2$) and then a metal layer 526 (such as a layer of gold, platinum, or combinations thereof) may be applied to form a plurality of photovoltaic elements 520.

One potential problem with processing a solar cell on a fiber is the inherent lack of surface area of a cylindrical body. In order to reduce the surface area limitations, nanorods 524 which have a high surface-area-to-volume ratio, are grown radially around the optical fiber 510. The optical fiber 510 is used to transmit light, while the nanorods 524 around the fibers serve to increase the surface area to which light is exposed.

In this way, light entering the optical fiber 512 from the tip propagates through the fiber 512 until it reaches a nanorod 524, at which point it causes $e^-$-$h^+$ pairs to be created, separated, and captured by an external circuit. Light entering the optical fiber 512 cannot escape until it interacts with a photovoltaic element, thereby increasing the solar conversion efficiency. In an ordinary thin film, flat substrate-type solar cell, some incident light is reflected before it can create $e^-$-$h^+$, pairs causing efficiency loss. A fiber optic design solves this problem, and it allows a volume-based three dimensional structure to absorb substantially more solar energy.

Figure 5C:
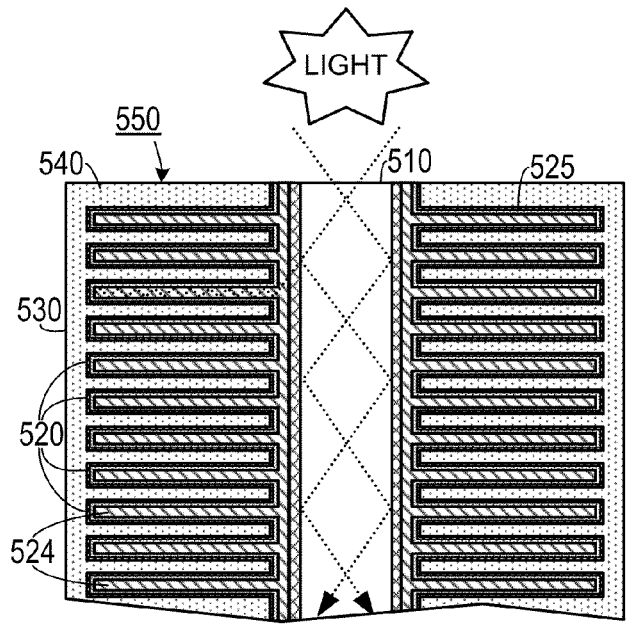
FIG. 5C is a cross-sectional view of an encapsulated fiber-mounted solar power generator.

As shown in FIG. 5C, the photovoltaic elements 520 can be encapsulated in an elongated conductive cladding or housing 530 (such as a platinum coated housing) that serves as a back electrode and also encapsulates an iodide based electrolyte 540, thereby forming a tubular photovoltaic collector 550. In this embodiment, light reflects along the walls of the optical fiber 510 until it enters one of the nanorods 524 and hits the junction of the ZnO nanorod 524, thereby creating an $e^-$-$h^+$ pair. One of the advantages of this embodiment is that light only needs to enter through an end of the fiber 510, but is trapped until it acts with one of the photovoltaic elements 520.

Figure 5D:
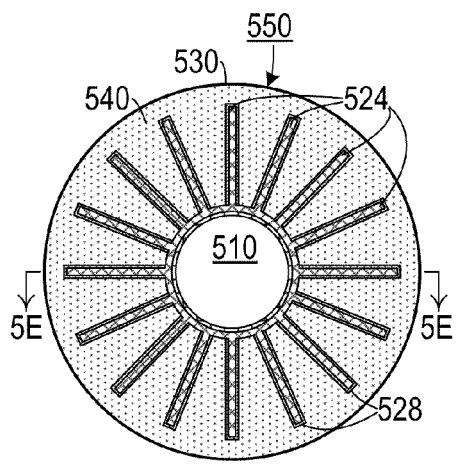
FIG. 5D is a top plan view of a dye-sensitized encapsulated fiber-mounted solar power generator.
Figure 5E:
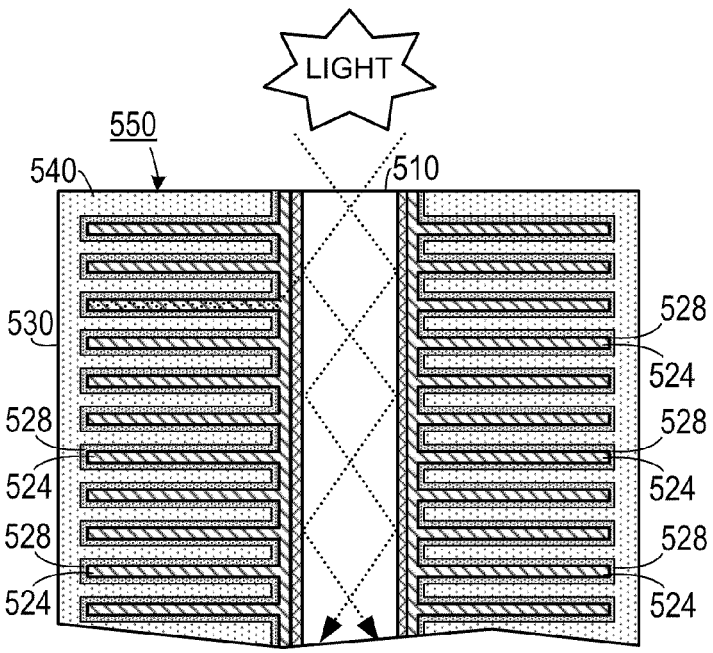
FIG. 5E is a cross-sectional view of the dye-sensitized encapsulated fiber-mounted solar power generator shown in FIG. 5D, taken along line 5E-5E.

As shown in FIGS. 5D and 5E, in one embodiment the photovoltaic elements 520 are dye-sensitized using a layer of dye 528, such as a ruthenium-based dye, applied to the nanorods 524 and then encapsulated in an elongated conductive cladding 530. In this embodiment, light reflects along the walls of the optical fiber 510 until it enters one of the nanorods 524 and hits the junction of the ZnO nanorod 524 and the dye layer 528, thereby creating an $e^-$-$h^+$ pair.

Figures 6, 7:
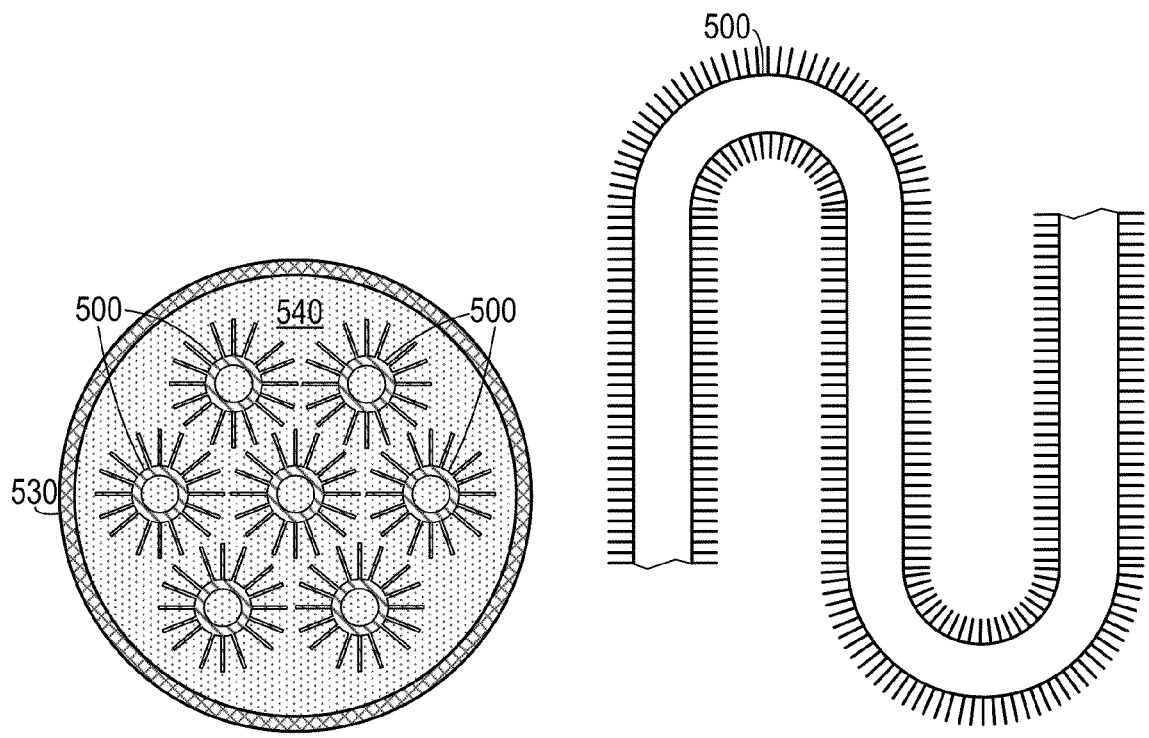
FIG. 6 is an elevational view of a fiber-mounted solar power generator.
FIG. 7 is a top plan view of a bundle of fiber-mounted solar power generators.
Figure 8:
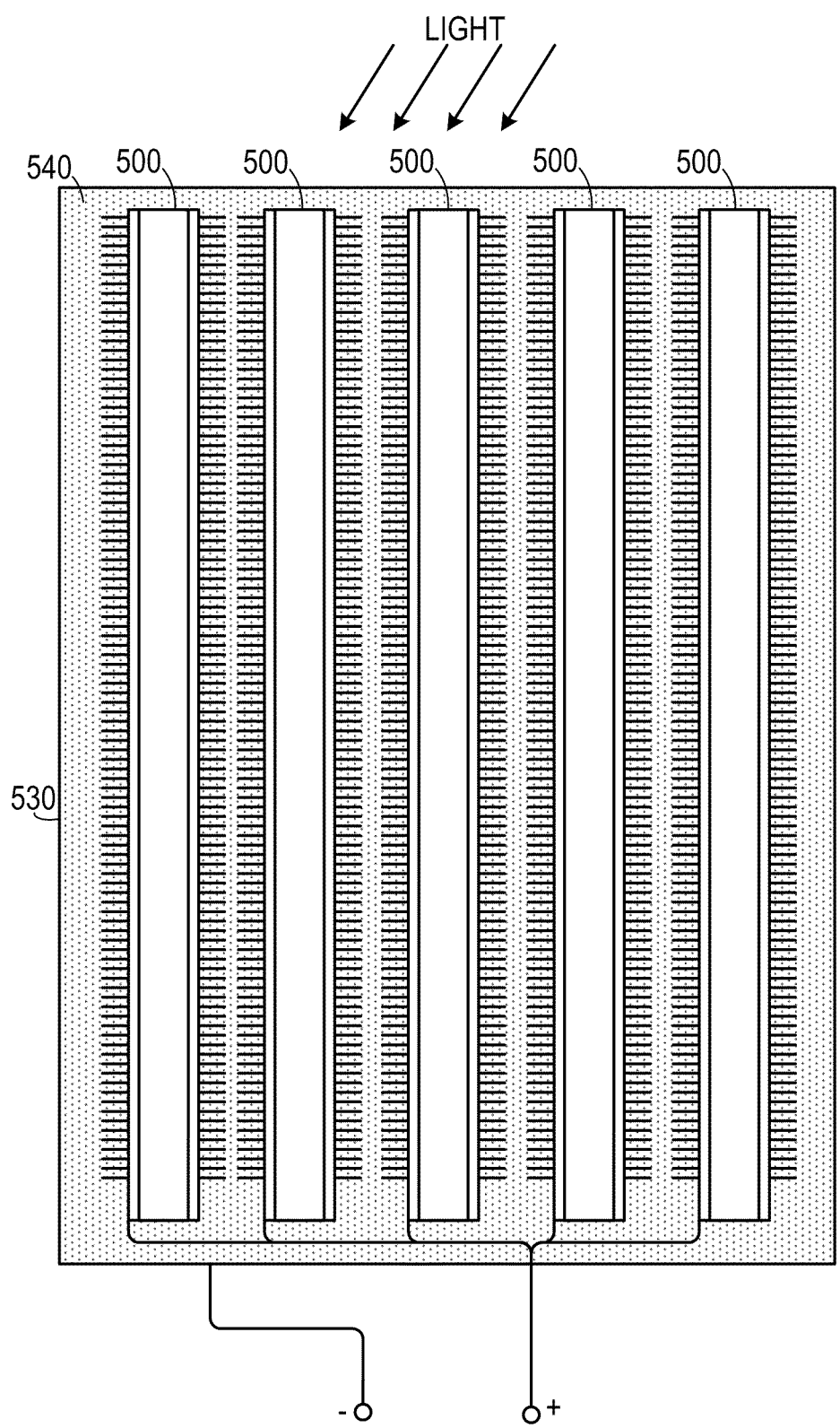
FIG. 8 is an elevational view of an array of fiber-mounted solar power generators.

As shown in FIG. 6, a fiber photovoltaic collector 500 of the type disclosed is flexible and can be adapted to many shapes, while still maintaining a high transmission of light. As shown in FIGS. 7 and 8, several different fiber photovoltaic collectors 500 can be placed together inside a single conductive tubular housing 530 and suspended in an electrolyte 540. This results in a low volume, high energy and high density device. Another potential advantage is that light can be collected from one location and guided to another location for solar energy conversion. For example, the fiber photovoltaic collector 500 can be buried underground in a dark location while the tip is exposed at the surface and directed towards the sun. This could be an important aspect for generating energy in space-confined areas.

When ZnO nanorods are subject to deflection, electrons flow from the nanowire to the metal electrode and back to the bottom of nanorods. In the hybrid system, they are sharing the metal electrode. Therefore, the negative electrode of the piezoelectric nanogenerator is directly connected to the positive electrode of the solar cell. These two types of electricity generators can thus be considered as in a serial connection. When functioning together, their outputs add up. When there is only one part working due to the restriction of circumstance, the other part will just be a path for the current flow. The combining of solar cell and piezoelectric nanogenerator will largely enhance the power generation efficiency of a simple piezoelectric nanogenerator or solar cell. Moreover, the environmental restriction for their operation will also be largely reduced.

A volume based three-dimensional solar cell will have profound improved efficiency. The solar nanogenerator employs fibers, which can be optical fibers or polymer fibers. Their cross-sections can be cylindrical or rectangular, or optically transparent plates. Such nanogenerators use the surface areas offered by the nanostructures on the fiber/plate surfaces and the multiple internal reflections of light within the fiber/plate to enhance the energy conversion efficiency.

In one embodiment the surfaces of the fibers/plates were first coated with a layer of transparent oxide such as ITO, on top of which are grown one-dimensional nanowire arrays. In one approach, n-type ZnO nanowires using ZnO film as seed are grown on the surface. In a second approach, n-type polymer nanowires will be grown on the surface, then, a p-type organic/inorganic semiconductor will be deposited on the surfaces of ZnO nanowires or polymer nanowires. At the top of p-type film, a thin metal film will be deposited as the electrode. The p-n junction formed is the core of solar cell.

This unit constructed is the basic unit, which will be used to stack in parallel to form the 3D solar cell. The sun light will shine in parallel to the fiber/plate parallel to the fiber axis or plate surface. Multiple reflections of the light inside the fiber/plate largely enhance the solar efficiency.

An alternative design, nanowires grown on a surface form a p-n junction with a p-type semiconductor material (organic or inorganic) deposited/vaporized on the surfaces of nanowires. An electrode is deposited at the top of the p-layer. A solar cell can be constructed by stacking the electrodes.

In another embodiment, the surface area is provided by nanowires on the fiber surface, on which a p-n junction layers being built. In such a case, the area of p-n junction is much enlarged, and the internal reflection of the light can reach the interface.

The three dimensional solar cell allows light to have multiple interactions with the dye molecules without increasing the electron transport distance. The three dimensional design has the following merits for applications: (1), the use of fibers/plates allows the solar cell to function remotely with high mobility. The solar cell unit can be hidden and located off the surface where the sunlight is available, making it possible for unique cosmetic designs and surface-confined applications. (2) the design concept transforms the traditional solar cell from action at the light illuminated side surface (e.g. "2D", or projection area) to action inside the volume (e.g., "3D") of the unit, making it possible for applications at a remote location such as underground and in deep water, in which the receiving of light is at the outside surface but the solar cell is located at a hidden place. To produce the same amount of electricity, the 3D solar cell could have a smaller size, greater mobility, more robust design, flexible shape, and potentially lower production cost. (3) the 3D solar cell has a high saturation limit and large dynamic range so that it works effectively from low light intensity below one sun to very intensive light intensity (>10 Suns). Furthermore, the 3D solar cell processing utilizes chemical synthesis at low temperatures and environmentally green and biological safe materials, with a great potential for scale-up. Finally, since ZnO nanowires can be grown on substrates of any material or shape at temperatures below 100° C., it is possible to replace quartz optical fibers with highly transparent polymer fibers. By combining the hybrid structure presented here with new dyes and surface coating materials, it is possible to significantly improve the efficiency of solar cells in general.

Conversion cells for harvesting solar energy and mechanical energy are usually separate and independent entities that are designed and built following different physical principles. Developing a technology that harvests multiple-type energies in forms such as sunlight and mechanical around the clock is desperately desired for fully utilizing the energies available in our living environment. One embodiment is a hybrid cell that is designed for simultaneously harvesting solar and mechanical energies. Using aligned ZnO nanowire arrays grown on surfaces of a flat substrate, a dye-sensitized solar cell is integrated with a piezoelectric nanogenerator. The former harvests solar energy irradiating on the top, and the latter harvests ultrasonic wave energy from the surrounding. The two energy harvesting approaches can work simultaneously or individually, and they can be integrated in parallel and serial for raising the output current and voltage, respectively, as well as power.

Figure 9:
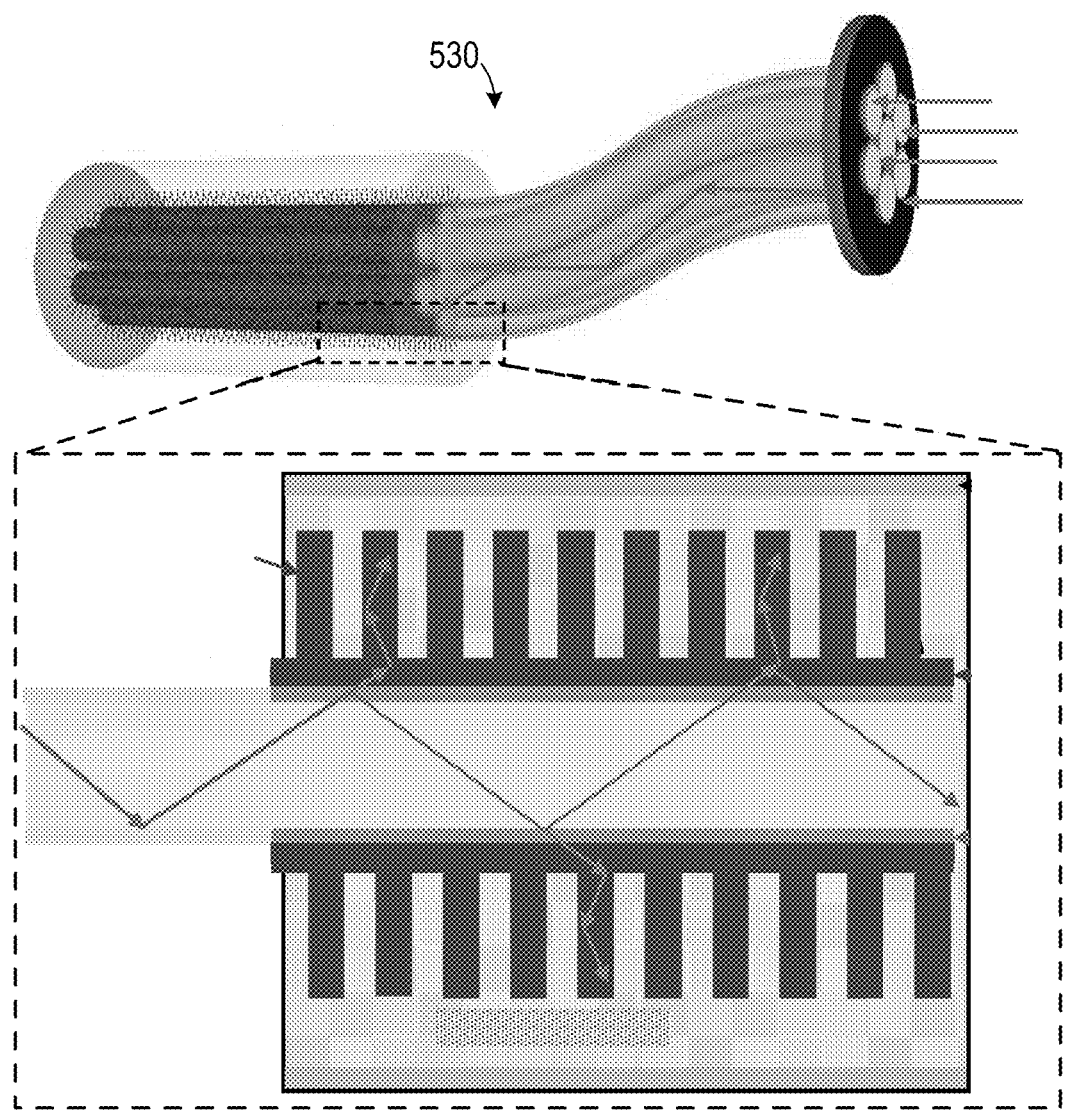
FIG. 9 is a side view of a bundle of fiber-mounted solar generator.

As shown in FIG. 9, a solar cell 530 employs a hybrid structure of optical fiber and semiconductor nanowires, such as ZnO, grown around the fiber. A pn junction based design, organic-inorganic hetero-junction, or a dye-sensitized structure is built at the surfaces of the nanowires. Light entering the fiber from the tip propagates through the fiber until it is bounced into a nanowire where it reaches a photovoltaic element or is otherwise absorbed. Light entering the fiber cannot escape until it interacts with a photovoltaic element, thereby increasing the solar conversion efficiency. The fiber is used to transmit light, while the nanowires around the fibers serve to increase the surface area of light exposure.

Figure 10A:
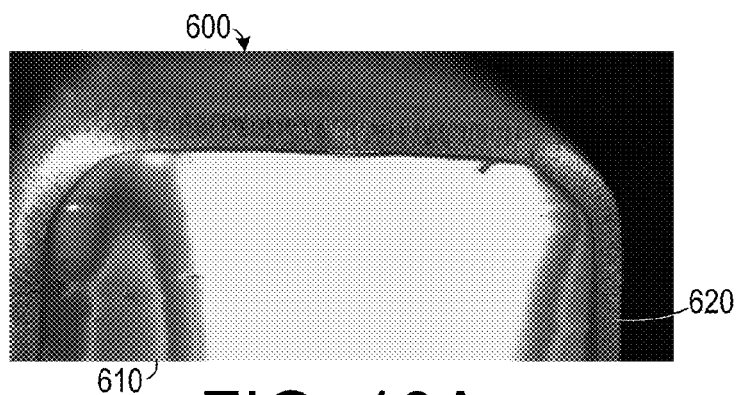
FIG. 10A is a micrograph of an end view of a fiber-mounted solar generator having a rectangular cross section.
Figure 10B:
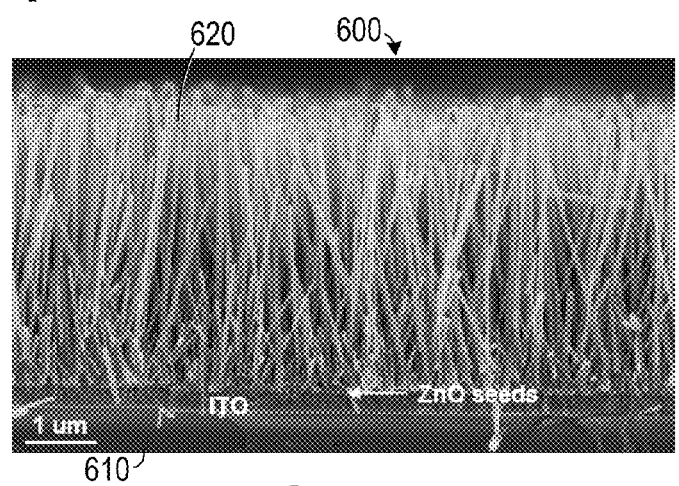
FIG. 10B is a micrograph showing a detail of the embodiment shown in FIG. 10A.
Figure 10C:
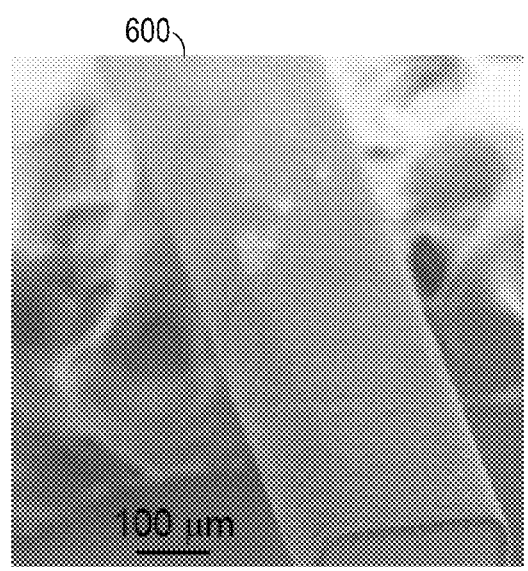
FIG. 10C is a micrograph showing a perspective view of the embodiment shown in FIG. 10A.
Figure 11:
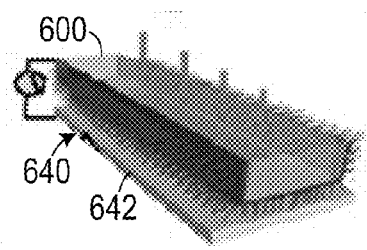
FIG. 11 is a perspective view of a planar solar nanogenerator cell.

In an alternate embodiment, as shown in FIGS. 10A-10C, the fiber 610 used in the solar energy collector 600 can have a rectangular cross section In one example of this embodiment, the nanowires 620 are grown outwardly from three of the four elongated surfaces of the fiber 610. As shown in FIG. 11, a cell 640 can use a solar collector 600 placed next to a conductive electrode 642 so as to be able to collect both solar and mechanical energy.

Figure 12:
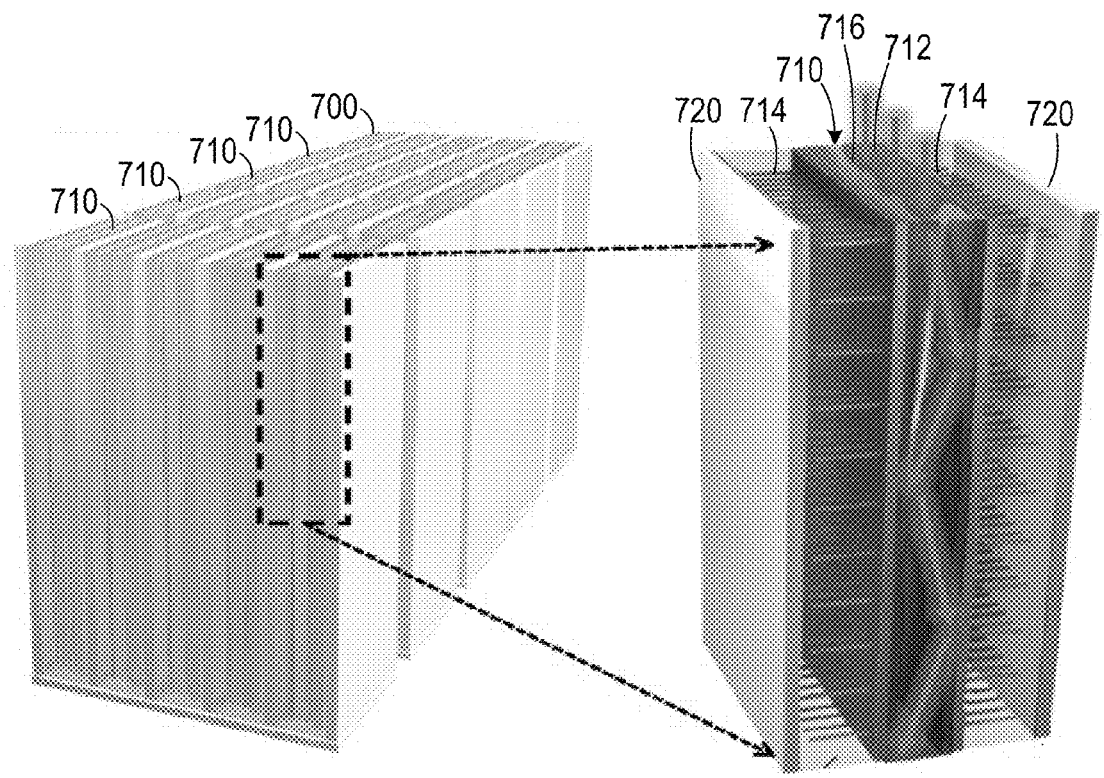
FIG. 12 is a perspective view of a battery of planar solar nanogenerator cells.

As shown in FIG. 12, in one embodiment, a solar nanogenerator cell 710 can include a planar optical wave guide 712 (such as a quartz slide) having at least exposed one end face 716 and two oppositely disposed planar faces from which nanowires 714 extend outwardly therefrom. Disposed at the ends of the nanowires are corresponding planar electrodes 720 made of a conductive material. In this embodiment, light enters the planar optical wave guide 712 through the end face 716 and travels through the planar optical wave guide 712, interacting with the nanowires 714 as it travels. Also, mechanical interaction between the nanowires 714 and the electrodes 720 generates additional current. An array of the solar nanogenerator cells 710 can be arranged to form a battery 700.

Solar energy is a promising sustainable energy resources for the future. Excitonic solar cells, including organic and dye sensitized solar cell (DSSC), appear to have significant potential as a low-cost alternative to conventional inorganic photovoltaic (PV) devices.

An optical fiber-nanowire hybrid based 3D DSSC by introduces solar light internally along the fiber. Such a structure is advantageous because it allows light to have multiple interactions with the dye molecules adsorbed on the nanowire (nanowire) surface without increasing the electron transport distance. Compared to the case of light illumination normal to the fiber axis from the outside of the device, the internal axial illumination can enhance the energy conversion efficiency by a factor of up to six for the same device.

In one embodiment, a battery 700 employs a quartz slide, instead of an optical fiber, and by alternatively sandwiching the quartz slides covered with aligned nanowire arrays with planar electrodes. In an experimental embodiment, the ZnO nanowires were grown normal to both surfaces of the quartz slide, which serves as a planar waveguide for light propagation. In this embodiment, when light reaches waveguide-nanowire interface, photons are coupled into the ZnO nanowires and then are absorbed by the dye molecules to generate electricity. In this experimental embodiment, the average enhancement of energy conversion efficiency increased by a factor of 5.8 when light propagating inside the slide compared to the case of light illumination normal to the surface of the slide from outside; and the full Sun efficiencies have been achieved up to 2.4% for ZnO nanowires.

The waveguide-nanowire 3D DSSC is an alternative sandwiching of planar waveguides that are covered by aligned ZnO nanowire arrays and planar counter electrodes. In one embodiment, the waveguide is first coated with indium tin oxide (ITO) film, and followed by a ZnO seed layer. The ZnO nanowire arrays are grown from the seed layer and are uniformly covered by a monolayer of dye molecules. The waveguide-nanowire working unit is sandwiched between two platinum (Pt) coated counter electrodes. The electrolyte is filled into the space between working and counter electrodes. It is worth noting that waveguide is made by fused quartz, whose refractive index (1.45) is smaller than that of coated ITO (~2) and ZnO (~2) films. So it is a waveguide with moderate leakage. For each internal reflection at the waveguide-ITO-ZnO nanowire interfaces, light will across the interface to reach the dye molecules through the nanowires as evanescent wave.

In one experimental embodiment, the solar cells were first fabricated by growing vertically aligned ZnO nanowire arrays with optimized density and length uniformly onto quartz slide (1~2.4 cm wide and 3~4 cm long with thickness of 200 μm, served as waveguide). Quartz slides were ultrasonically cleaned in acetone, ethanol and de-ionized (DI) water consecutively. The slide was coated with 300 nm thick ITO layer with a sheet resistance of 30~50Ω/square on one (both) side (sides) by RF magnetron sputtering. The 300 nm thick ZnO seed layer was then sputtered on top of the ITO. The aligned ZnO arrays were synthesized via hydrothermal (HT) method on the surface of the slide with desired morphologies as tuned by changing the growth conditions. In general, nanowires are longer, thicker and denser at higher solution concentration, higher temperature and longer time. Optimized ZnO nanowire arrays were synthesized in a solution containing 16 mM zinc chloride (Alfa aesar) and 16 mM hexamethylenetetramine (HMTA) (Fluka) at 95° C. for 16 hours in a Yamato convection box oven. Aspect ratio of the nanowire was controlled by adding (0-5 mL in 100 mL solutions) ammonium hydroxide (Aldrich, 28% in volume). All chemicals were reagent grade. The ZnO nanowire arrays were grown on one side of the slide by floating the substrate on the nutrient solution surface. While the ZnO nanowire arrays were grown on double-side of the slide by immersing the substrate into the solution with the slide surface normal to the solution surface. nanowires coated slide was rinsed using ethanol and air dried in a dry box (humidity less than 1%) at room temperature for 24 hours.

In this embodiment, the nanowire arrays were sensitized in a 0.5 mM N719 dye solution in dry ethanol for one hour. A Pt (80 nm) layer was evaporated on a pre-cleaned glass substrate with a Ti (20 nm) adhesion layer to serve as the counter electrode. The waveguide-nanowire unit was sandwiched between two Pt coated counter electrodes. The spacing was controlled using Surly film (60 μm thick, Solaronix), which also sealed the device when heated to 100° C. The internal space of the device was filled with a liquid electrolyte (0.5 M LiI, 50 mM 12, 0.5 M 4-tertbutylpyridine in 3-methoxypropionitrile (Fluka)) via capillary effect.

The solar cell was characterized using a solar simulator (300 W Model 91160, Newport) with an AM 1.5 spectrum distribution calibrated against a NREL reference cell to simulate a full Sun intensity (100 mW cm-2) accurately. The J-V curve was measured under two configurations: light illumination normal to waveguide surface (NS) and parallel to waveguide surface (PS). IPCE measurements were carried out using a 300 W Xe lamp light source coupled to a monochromator (Oriel). A reference Si photodiode calibrated for spectral response was used for the monochromatic power-density calibration.

Figure 13:
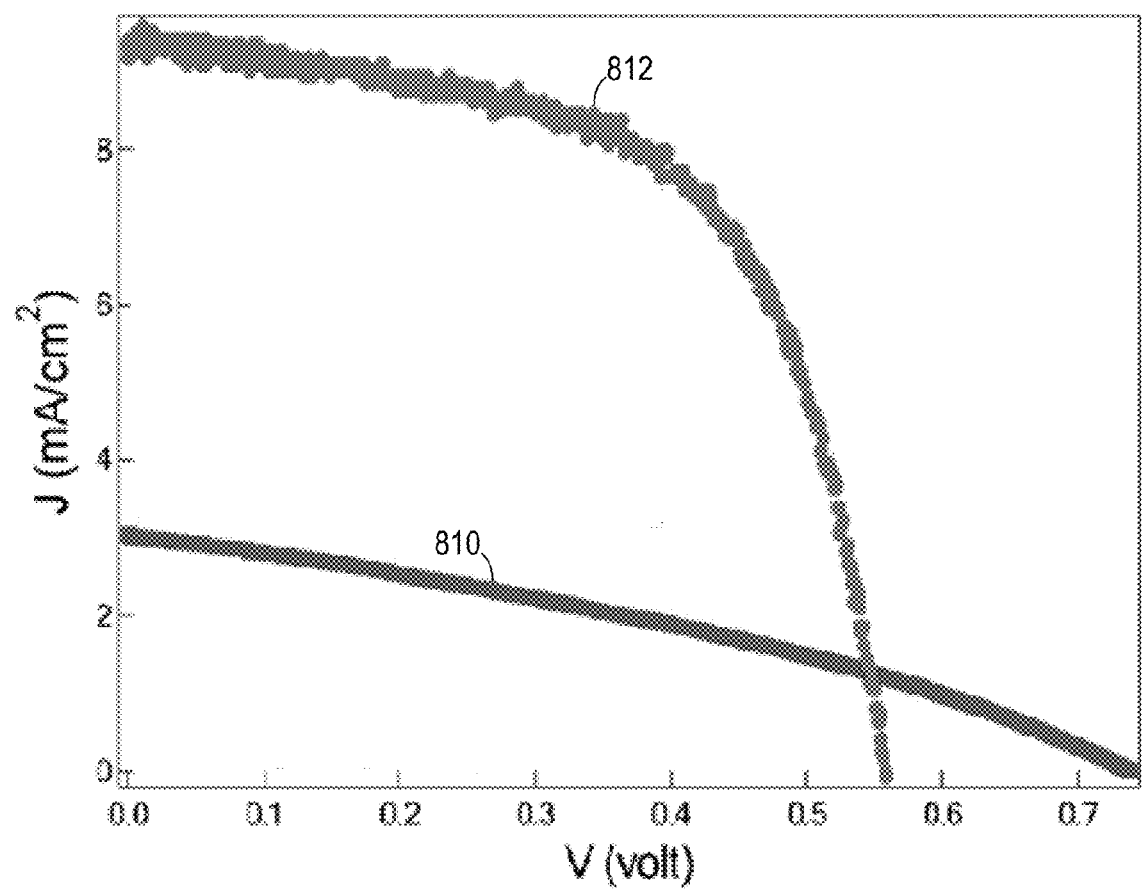
FIG. 13 is a graph characterizing current density vs. voltage measured in one experimental embodiment.

First studied were the characteristics of solar cells in NS and PS configurations with nanowires coated on one side of the slide. For the PS case, the light was coupled into the waveguide from the edge of the quartz slide. The surface coated with and without nanowires were both covered by Pt coated glass slides to avoid the light leakage at the waveguide entrance. The power generated by the solar cell depends on the angle of incident light. To obtain the highest output, the waveguide surface was initially placed in parallel to the incident light. Then the short circuit current was monitored to reach its maximum by rotating the solar cell. The J-V characteristic was measured afterwards. An energy conversion efficiency of 2% was obtained. The J-V curves for PS and NS are shown in FIG. 13. The open circuit voltage VOC of the PS case 810 is significantly lower than that of the NS case 812 resulting from lower local incident light intensity at the ZnO-dye interface for the PS case due to multiple internal reflections in the waveguide. The short circuit current density (JSC) of the PS case is much higher than that of the NS case as a result of better light absorption. The large JSC for the PS case and efficiency enhancement are based on a hybrid structure that integrates an optical waveguide and aligned ZnO nanowire arrays, which increases the light absorbing surface area due to multiple internal reflections and provides fast electron transfer pathway along ZnO nanowires.

Light coupling between waveguide and nanowires are effective due to the following processes. First, the light hits the waveguide-ITO interface upon the propagation down the waveguide. The refractive index of the waveguide (fused quartz) is ~1.45, which is smaller than that of the coating layers (ITO, ZnO) ~2. A high index of refraction material allows the light to escape into the dye from waveguide. Second, the scatters (such as defects, air bubble and impurities) in the waveguide can change the light traveling directions, which enhance the light coupling between the waveguide and nanowires. The solar cell's performance can be adjusted and optimized by engineering scatters inside the waveguide. Finally, evanescent wave coupling, by which electromagnetic waves are transmitted from one medium to another, should be considered. The first two mechanisms dominate the light coupling between the waveguide and nanowires.

For the solar cell with nanowires coated on one side of the slide, the light can partially leak out from the side without nanowires coating, and efficiency is limited. By growing nanowires on both sides of the slide, the active surface area is doubled from that of one side coated cell. This improved design takes advantage of larger and fully covered surface area, which allows more efficient light collection with minimum light leakage, and higher energy conversion efficiency is expected. Compared to one side coated slide, double-side coated slide has larger JSC and fill factor (FF) because of more efficient photon collection. The smaller Voc for the double-side coated slide is due to lower local incident light intensity. The highest efficiency received for double-side coated slide was 2.4%, which was ~20% higher than that for one side coated slide (note, the enhancement is not a factor of two because at the surface without nanowires, there is a certain degree of total internal reflection at the quarts/air interface). The superior performance of the double-side coated waveguide was further evaluated by incident-photon-to-electron conversion efficiencies (IPCE) measurements. Single and double-side coated solar cells are both peaked at 570 nm, which suggests the more efficient collection of longer wavelength photons for waveguide-nanowire solar cell. The peak value of double-side coated waveguide is larger than that of the one side coated waveguide as expected. From the architecture point of view, the double-side coated waveguide is a good choice as the building block stacked layer-by-layer to form a volume based solar cell at a large scale.

The planar waveguide-nanowire 3D DSSC has certain advantages over the optical fiber-nanowire hybrid cell. First, it's easy to fabricate using general methods of making flat (2D) DSSCs. The flat working and counter electrodes can be stacked layer-by-layer to form a volume based solar cell without limitation. On average, the enhancement of energy conversion efficiency by a factor of 5.8 was achieved when light propagating inside the waveguide compared to the case of light illumination normal to the surface of slide; and the full Sun efficiencies have been achieved up to 2.4% for the 3D solar cells with ZnO nanowires grown on double-side of the waveguide. Also, the planar waveguide allows a large scale fabrication of the 3D solar cell, while the integration of the fiber based solar cell with electrode is a rather challenging task.

This experimental embodiment demonstrated an approach to fabricate waveguide-nanowire integrated 3D DSSC whose energy conversion efficiency was enhanced as light propagating inside the waveguide compared to the case of light illumination normal to the surface of the waveguide. The configuration of the 3D hybrid solar cell effectively increases the light absorbing surface area due to multiple internal reflections without increasing electron path length to the collecting electrode as well as an improved charge collection with the introduction of stacked planar electrodes, resulting in a significant improvement in energy conversion efficiency. The full Sun efficiencies have been achieved up to 2.4% for the 3D solar cells with ZnO nanowires grown on double sides of the waveguide. The planar waveguide-nanowire 3D solar cells have the following features for scaling up. First, ZnO nanowires can be grown on substrate uniformly on a large scale via chemical synthesis at temperature below 100° C. The material and growth process are low cost and environmentally green. Second, this design can adopt the fabrication and package techniques from traditional 2D solar cells. Third, the active area for electricity generation of the cell is much larger than that of fiber 3D solar cell, while the energy conversion efficiency remains the same, clearly indicating its potential for scale up. Also, the flat symmetric structure of a unit cell feasible for close packed stacking of multiple cells in a layer-by-layer fashion to build large scale solar cells. It is possible to replace the quartz slide with highly transparent polymer substrates. The waveguide-nanowire 3D architecture provides a general approach for fabricating high efficiency, large scale excitonic solar cells, such as dye sensitized and organic solar cells.

Figure 14:
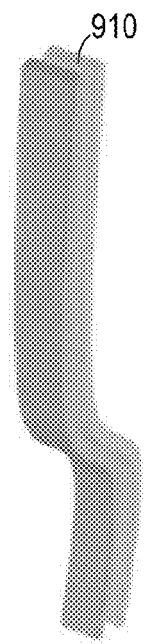
FIG. 14 is a dye-sensitized solar cell employing a flat fiber geometry.

A dye-sensitized solar cell employing a flat rectangular fiber geometry 910 is shown in FIG. 14. A rectangular fiber yields a higher solar cell efficiency because the geometry leads to better packaging. Compared to a circular fiber, a rectangular working electrode can have a higher contact area with the Pt counter electrode.

Figure 15:
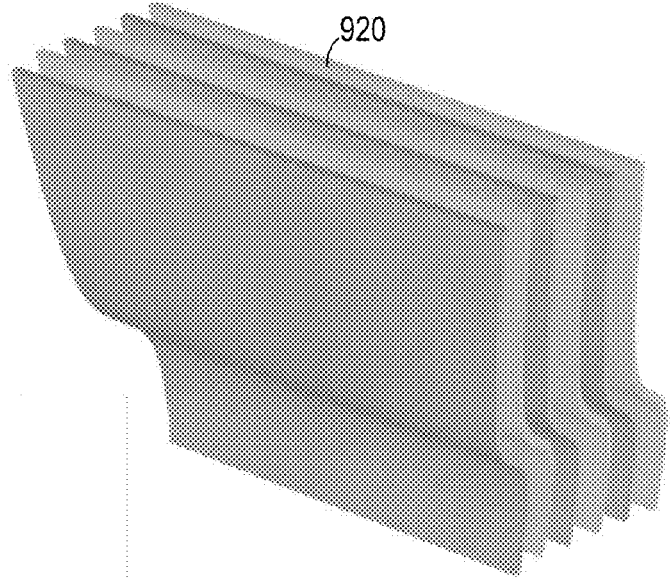
FIG. 15 is a dye-sensitized solar cell employing a ribbon geometry.

A dye-sensitized solar cell employing a ribbon geometry 920 is shown in FIG. 15. The ribbon is made of quartz and can be as simple as a quartz cover slip used in microscopy. The glass ribbon is coated with ITO and ZnO thin films. ZnO nanowires are synthesized on the ZnO thin film and coated with N719 dye. The working electrode is placed into electrical contact with the Pt counter electrode via a hole transporting electrolyte solution.

The ribbon geometry has an advantage in that it allows for ultra-high contact area between the working and counter electrodes. The high contact area will allow for a greater active of the solar cell device. In the rectangular fiber geometry, the short sides arc not in contact with an electrode so no light harvesting can be carried out on these two surfaces. However, in a ribbon design the device behavior can be modeled as a surface since ribbon length is so much greater than its width. The high surface area of the ribbon surface will allow for a much higher contact area between the working and counter electrodes. Another advantage of the ribbon design is its scalability. The ribbon-shaped working and counter electrode can be stacked to form a volume-based solar cell. In this way, the large surface area of the ribbons can be in intimate contact while being stacked. Electrical contact can be made to each individual ribbon electrode. There should not be a limit to the number of ribbons that can be stacked.

Figure 16:
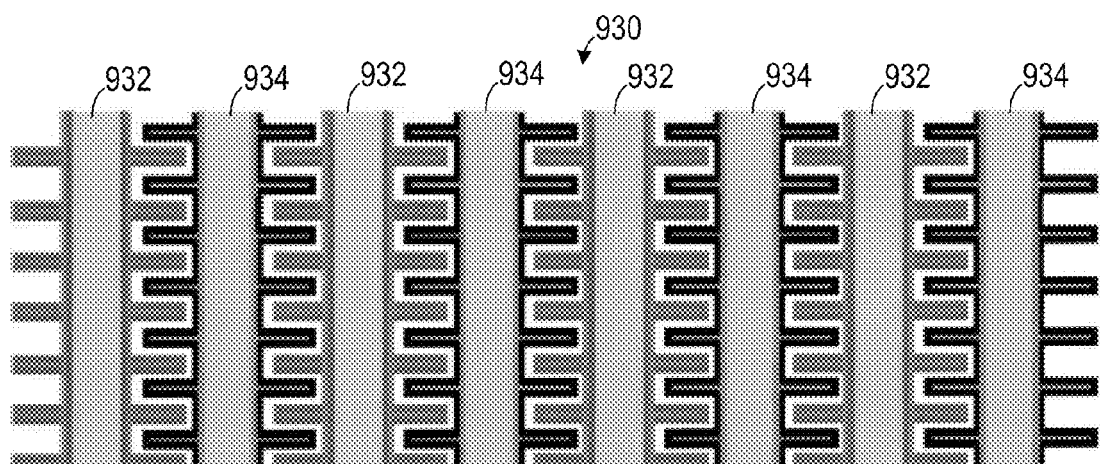
FIG. 16 is a plan view showing an interdigitated electrode configuration.

In an interdigitated electrode configuration 930, as show in FIG. 16, the working electrode 932 is the same as before. It includes a rectangular quartz fiber or quartz ribbon coated with ITO and ZnO thin films. ZnO nanowires are grown from the seed layers and coated in N719 dye. In the interdigitated electrode design, however, the flat Pt counter electrode 934 is replaced with Pt-coated ZnO nanowires. The counter electrode 934 includes Pt-coated ZnO nanowires grown or a rectangular fiber or ribbon substrate. In this way, the counter electrode will have a similar topography as the nanowire working electrode.

The finger-like working and counter electrodes 934 can be brought together to form interdigitated electrodes. With the interdigitated electrode 930 configuration, the close electrode spacing could reduce hole transport time through electrolyte. Also, the increased PI surface area could potentially increase catalytic activity. The configuration could also allow for close-packed stacking between working electrodes 932 and counter electrodes 934, which can maximize the effective solar cell volume contributing towards light harvesting. Also, this configuration could be used as a nanogenerator so the device could potentially harvest electromechanical energy under a mechanical stimulus.

The flat symmetric structure of a unit cell allows close packed stacking of multiple cells in a layer-by-layer fashion to build large scale 3D solar cell, which can be manufactured in a manner in which the counter electrodes can be molded in a comb configuration, and waveguide-nanowire units are plugged into the counter electrode housing, then the internal space of the device is filled with electrolyte and the solar cell is sealed and fully packaged.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A solar collector cell, comprising:
   a. an optically transparent elongated prism including a plurality of flat faces that includes a material that causes light entering therein to be reflected internally;
   b. a plurality of elongated nanostructures extending outwardly from at least one of the plurality of flat faces;
   c. an optically sensitive dye adsorbed onto the plurality of elongated nanostructures, the optically sensitive dye configured to absorb photons from light received through the optically transparent elongated prism; and
   d. an electrode, coupled to the plurality of elongated nanostructures, that is configured to transport electrons generated by the optically sensitive dye as a result of light being absorbed therein.

2. The solar collector cell of claim 1, wherein the elongated nanostructures comprise a piezoelectric material.

3. The solar collector cell of claim 2, wherein the piezoelectric material comprises zinc oxide.

4. The solar collector cell of claim 2, further comprising a conductive electrode disposed adjacent to the elongated nanostructures, the conductive electrode including a material that forms a band gap between the elongated nanostructures and the conductive electrode.

* * * * *